United States Patent [19]

Ishida

[11] 4,362,906
[45] Dec. 7, 1982

[54] FM RECEIVER
[75] Inventor: Kohji Ishida, Tokyo, Japan
[73] Assignee: Pioneer Electronic Corporation, Tokyo, Japan
[21] Appl. No.: 185,846
[22] Filed: Sep. 10, 1980
[30] Foreign Application Priority Data Sep. 10, 1979 [JP] Japan .............................. 54-116023

[51] Int. Cl.³ ............................................ H04H 5/00
[52] U.S. Cl. .............................. 179/1 GD; 179/1 GE; 179/1 GJ
[58] Field of Search ............. 179/1 GC, 1 GB, 1 GD, 179/1 GE, 1 GJ

[56] References Cited
U.S. PATENT DOCUMENTS 4,037,056 7/1977 Ienaka et al. ..................... 179/1 GJ
4,300,019 10/1981 Toyomaki ....................... 179/1 GE Primary Examiner—R. J. Hickey
Attorney, Agent, or Firm—Sughrue, Mion, Zinn, Macpeak & Seas

[57] ABSTRACT

An FM receiver in which the length of the signal path is significantly shortened and in which separation between right and left channels is implemented by adjusting a DC bias voltage. A pulse train signal having a frequency dependent upon the instantaneous frequency of the received FM signal is generated. Subcarrier signals in and out of phase with a pilot signal component in the pulse train signal are produced and a variable DC component is added thereto. The subcarrier signals including the DC component are multiplied to obtain pulse train signals. The pulse train signals are integrated to yield right and left stereophonic channel signals.

9 Claims, 7 Drawing Figures

FM RECEIVER

BACKGROUND OF THE INVENTION

The present invention relates to FM receivers. More particularly, the invention relates to an FM stereophonic signal demodulation circuit for use in an FM stereophonic receiver.

In an FM stereophonic receiver, the received FM signal is converted into an intermediate frequency signal which is detected by the FM detector to obtain a so-called "composite signal". The component signal is separated and demodulated into right and left stereophonic signals by the multiplex demodulation circuit.

Recently, there has been a strong demand for improvement in the quality of sound produced by FM tuners. That is, the provision of so-called "high fidelity tuners" has been required. In order to meet this requirement, it is essential to make the length of the signal path as short as possible.

In the above-described FM tuner stereophonic signal demodulation system, the signal passes through two circuits, namely, an FM detection stage and a multiplex demodulation stage. In so doing, the signal is unavoidably distorted by the circuits. Therefore, the quality of sound produced by such a high fidelity tuner is limited.

Accordingly, an object of the invention is to provide an FM receiver in which the length of the signal path is made as short as possible so that distortion of the signal is prevented whereby the quality of sound produced by the tuner is improved.

SUMMARY OF THE INVENTION

In accordance with the invention, FM detection and separation and demodulation of the right and left channel signals are carried out simultaneously. A pulse train signal, for instance a PPM signal, carrying information corresponding to the instantaneous frequency of a received FM signal is generated. A subcarrier signal in phase with a pilot signal component in the pulse train signal or the FM signal and a subcarrier signal opposite in phase to the first-mentioned subcarrier signal are generated with a predetermined DC component included therein. The subcarrier signal, including the DC component and the pulse train signal, are subjected to a multiplication operation to obtain multiplication signals. The right and left channel signals included in the FM signal are separated as outputs from the multiplication signals.

DESCRIPTION OF THE PREFERRED EMBODIMENTS

The invention will be described with reference to the accompanying drawings.

Figure 1:
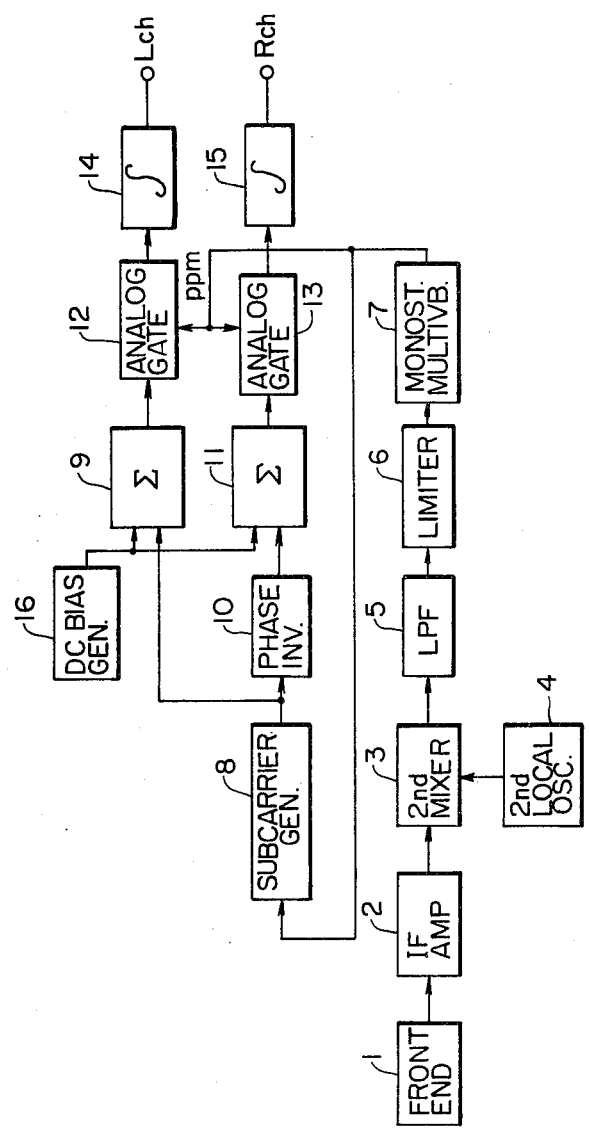
FIG. 1 is a block diagram of a preferred embodiment of an FM receiver constructed according to the invention.

FIG. 1 is a block diagram showing a preferred embodiment of a receiver of the invention. A 10.7 MHz IF (intermediate frequency) signal outputted by a front end 1 is amplified by an IF amplifier 2 and is then applied to a second mixer 3. In the second mixer 3, the IF signal is converted to an FM signal having a center frequency of 1 MHz, for instance, which is lower than the 10.7 MHz frequency of the IF signal, by being mixed with a local oscillation signal which is produced by the second local oscillator 4 having a predetermined frequency. This is done to facilitate the signal processing operation. The converted signal is applied through a low-pass filter 5 to a limiter 6 where it is subjected to amplitude limitation. A monostable multivibrator 7 is provided which is triggered, for instance, by a rise of the amplitude-limited output of the limiter 6. Accordingly, the monostable output is a PPM (pulse position modulation) signal which is produced by pulse position modulation. The transition times of the monostable output vary in correspondence with the instantaneous frequency of the converted FM signal.

As the PPM signal is a pulse train signal corresponding to the FM signal, its frequency spectrum includes a frequency component represented by:

$$A(t) = (L + R) + (L - R)\sin \omega t + P \sin \frac{\omega}{2} t, \quad (1)$$

where R and L are the right and left signals, respectively, $\omega$ is the subcarrier angular frequency, and P is the amplitude of the pilot signal which has a frequency of $\omega/2$. Thus, it can be understood that the equation (1) represents a so-called composite signal component. A subcarrier signal generating circuit 8 is provided which detects the pilot signal component from the composite component and in response thereto generates a subcarrier signal synchronous with the pilot signal. The circuit 8 can be readily implemented with a conventional PLL (phase-locked loop) as shown in FIG. 2.

Figure 2:
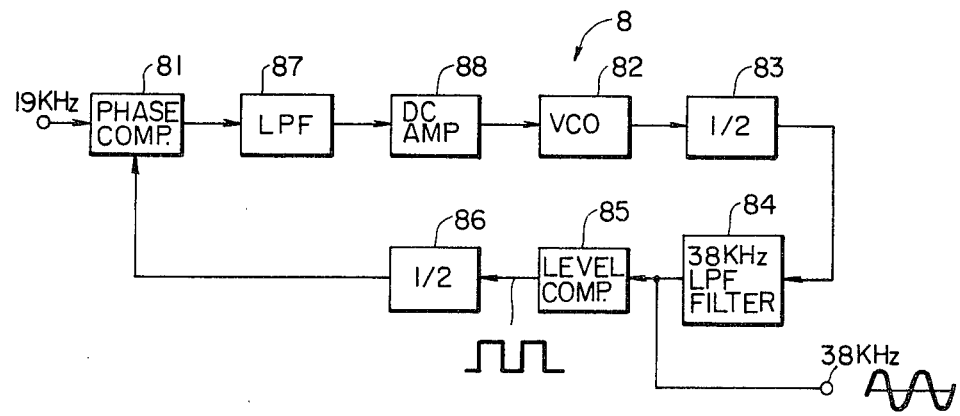
FIG. 2 is a block diagram showing a subcarrier signal generating circuit in FIG. 1.

In FIG. 2, the PPM signal output is applied to a phase comparator 81. A VCO (voltage-controlled oscillator) 82 has a free-running frequency which has been set to 76 KHz = 19 KHz × 4. The output of the VCO 82 is applied to a one-half frequency divider 83 as a result of which a 38 KHz square wave signal is produced. This 38 KHz signal is applied to a LPF (low-pass filter) 84 and is there converted into a sinusoidal subcarrier signal.

The output of the LPF 84 is employed as the subcarrier signal and is in phase with the pilot signal. Furthermore, the output of the LPF 84 is applied to a level comparator 85 which converts it to a square wave pulse signal. The square wave output of the level comparator is converted to a 19 KHz signal by a one-half frequency divider 86. The difference in phase between the 19 KHz signal and the pilot signal component in the PPM signal is determined by the phase comparator 81. As a result, an output corresponding to the phase difference is applied by the phase comparator 81 through a LPF 87 and a DC amplifier 88 to the VCO 82 to control the VCO 82. Accordingly, a sinusoidal subcarrier signal, which is completely synchronous with and in phase with the pilot signal component, is provided at the output of the 38 KHz filter 84.

The 38 KHz subcarrier signal is applied, without modification, to a first adder 9, and is applied through a phase inverter 10 to a second adder 11. That is, the inverted phase signal is applied to the adder 11. Furthermore, a DC component from a DC bias generating circuit 16 is applied to the other input terminals of the adders 9 and 11. Therefore, the normal and inverted phase signals of the subcarrier signal are converted into signals which are level-shifted by predetermined DC levels and these signals are applied to analog gates 12 and 13, respectively.

The above-described PPM signal is employed to control the on-off operations of the analog gates 12 and 13. The outputs of the gates 12 and 13 are inputted to integrator circuits 14 and 15, respectively. The outputs of the integrator circuits 14 and 15 form the left and right channels signals, respectively.

If the DC level of the DC bias generating circuit 16 is set to $\frac{1}{2}$ and the subcarrier signal is $\sin \omega t$, then the output $C(t)$ of the adder 9 and the output $C'(t)$ of the adder 11 can be represented by:

$$C(t) = \sin \omega t + \tfrac{1}{2} \text{ and} \quad (2)$$
$$C'(t) = -\sin \omega t + \tfrac{1}{2}. \quad (3)$$

The analog gates 12 and 13 output the signals represented by the equations (2) and (3) by being switched by the PPM signal. This operation is equivalent to a multiplication operation. As the PPM signal includes in its spectrum the composite signal component $A(t)$ indicated by the equation (1), the outputs of the analog gates can be considered as the products of these signals. Thus, the output of the analog gate 12 and the output of the analog gate 13 can be represented by the following equations (4) and (5), respectively:

$$A(t) \times C(t) = (L + R)/2 + (L - R)/2 \quad (4)$$
$$- \{(L - R)\cos 2\omega t\}/2 + '\{(L - R)\sin \omega t\}/2$$
$$+ (L + R)\sin \omega t + (\sin \omega t + \tfrac{1}{2}) \cdot P \sin \tfrac{\omega}{2} t, \text{ and}$$

$$A(t) \times C'(t) = \quad (5)$$
$$(L + R)/2 - (L - R)/2 + \{(L - R)\cos 2\omega t\}/2$$
$$+ '\{(L - R)\sin \omega t\}/2 - (L + R)\sin \omega t$$
$$- (\sin \omega t - \tfrac{1}{2}) \cdot P \sin \tfrac{\omega}{2} t.$$

The signals represented by the equations (4) and (5) are applied to the integrator circuits 14 and 15, which perform a low-pass filter function, as a result of which the signal components $\sin \omega t$, $\sin \omega/2 t$, and $\cos 2\omega t$ are removed. Thus, the outputs of the integrator circuits 14 and 15 can be represented by the following expressions, respectively:

$$A(t) \times C(t) = (L+R)/2 + (L-R)/2 = L$$

and $$A(t) \times C'(t) = (L-R)/2 - (L-R)/2 = R.$$

Thus, the right and left channel signals are separately outputted. If, in this connection, the subcarrier signal is not completely in phase with the pilot signal, the separation of the right and left channel signals becomes inadequate. However, the right and left channel signals can be sufficiently separated by adjusting the DC level of the DC bias generating circuit to a suitable value instead of $\frac{1}{2}$.

Figure 3A:
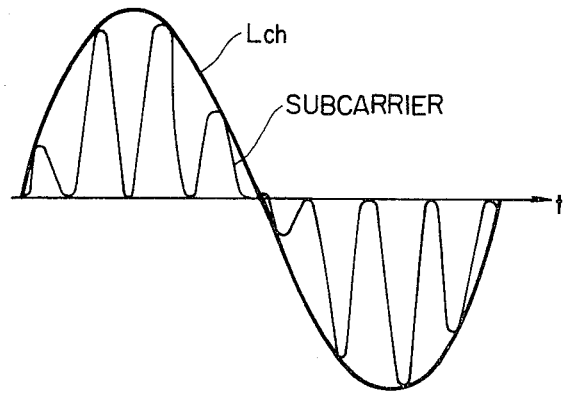
FIGS. 3A-3E are waveform diagrams for a description of the operation of the embodiment shown in FIG. 1.
Figure 3B:
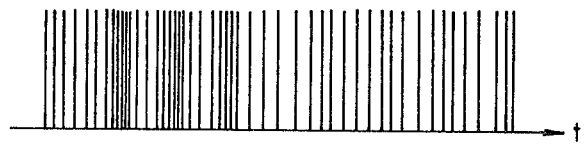
Figure 3C:
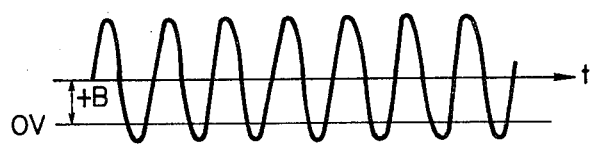
Figure 3D:
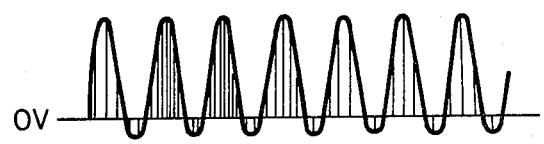
Figure 3E:
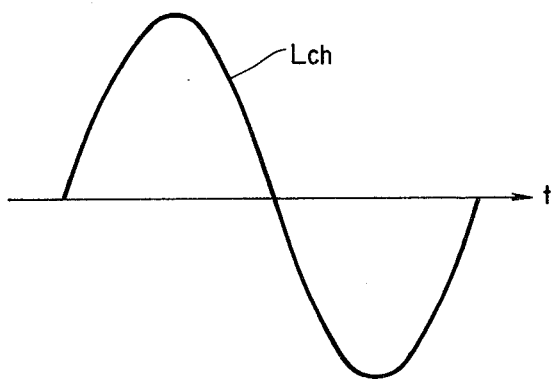

The operation of the receiver circuit of the invention has been quantitatively described above. The operation will be further described with reference to the waveforms shown in FIGS. 3A–3E. The case where only a left channel signal is present will be described for convenience in description. The 38 KHz subcarrier signal is amplitude modulated with the left channel signal (actually here the (L−R) signal) as shown in FIG. 3A and the converted FM signal is produced as a signal including the 38 KHz subcarrier signal. Therefore, the pulse density of the PPM signal increases as the amplitude of the signal shown in FIG. 3A increases. In contrast, the pulse density decreases as the signal amplitude decreases as indicated in FIG. 3B. FIG. 3C shows the output waveform from each of the adders 9 and 11 which are level-shifted by a DC voltage +B. Accordingly, the analog gate output is as shown in FIG. 3D in which a sine curve forms the envelope waveform of the gate output. Accordingly, integration of the output signal of FIG. 3D yields the waveform shown in FIG. 3E, namely, the left channel signal of FIG. 3A. Demodulation is achieved in this manner.

In the above description, a PPM signal is employed as the input to the subcarrier signal generating circuit 8. However, if the output of the IF amplifier 2 is detected using an ordinary quadrature FM detector to provide a composite detection signal, the subcarrier signal can be obtained from the composite detection signal. In this case, the detector is used merely for obtaining the pilot signal and therefore its distortion factor is not important. Accordingly, the detector may be simple in arrangement.

As is apparent from the above description, according to the invention, the right and left channel signals are separated directly from the received FM signal for demodulation. Accordingly, the length of the signal path is significantly reduced which results in high fidelity reproduction. Furthermore, as the separation adjustment is implemented merely by adjusting a DC bias level, the circuitry used can be quite simple.

What is claimed is:

1. An FM receiver comprising:
    pulse modulation signal generating means for generating a pulse train signal having a parameter corresponding to an instantaneous frequency of a received FM signal;
    subcarrier signal generating means for selectively detecting a pilot signal component included in one of said received FM signal and said pulse train signal to generate a first subcarrier signal in phase with said pilot signal and a second subcarrier signal opposite in phase to said pilot signal, said first and second subcarrier signals including a predetermined DC component;
    multiplication means for separately multiplying first and second subcarrier signals including said predetermined DC component by said pulse train signal to provide multiplication signals; and
    means for providing output stereophonic signals included in said received FM signal from said multiplication signals.

2. The FM receiver as claimed in claim 1 in which said pulse modulation signal generating means operates to provide a pulse position modulation signal having signal transitions which vary in response to the instantaneous frequencies of said received FM signal.

3. The FM receiver as claimed in claim 1 or 2 in which said multiplication means comprises analog gate means coupled to be opened and closed by said pulse train signal to control the transmission of said subcarrier signals therethrough.

4. The FM receiver as claimed in claim 1 or 2 in which separation of first and second channel signals is controlled by adjusting said predetermined DC component.

5. The FM receiver as claimed in claim 1 or 2 wherein said output signal providing means comprises integrator means.

6. The FM receiver as claimed in claim 1 or 2 wherein said multiplication means comprises analog gate means.

7. An FM receiver comprising:
a front end section;
an intermediate frequency amplifier;
a local oscillator;
a mixer having inputs coupled to an output of said intermediate frequency amplifier and said local oscillator;
a first low-pass filter having an input coupled to an output of said mixer;
a limiter having an input coupled to an output of said first low-pass filter;
a monostable multivibrator having an input coupled to an output of said limiter;
a subcarrier signal generator having an input coupled to an output of said monostable multivibrator;
a phase inverter having an input coupled to an output of said subcarrier generator;
first and second analog signal adder circuits, said first analog signal adder circuit having a first input coupled to an output of said subcarrier generator and said second analog signal adder having a first input coupled to an output of said phase inverter;
an adjustable DC bias supply having an output coupled to second inputs of each of said first and second analog signal adders;
first and second analog gates having a control input coupled to said output of said monostable multivibrator and said first analog gate having a signal input coupled to an output of said analog signal adder circuit and said second analog gate having a signal input coupled to an output of said second analog signal adder circuit; and
first and second integrator circuits having inputs coupled, respectively, to outputs of said first and second analog gates, separated stereophonic signals being produced on the outputs of said first and second integrator circuits.

8. The FM receiver as claimed in claim 7 wherein said subcarrier generator comprises a phase-locked loop.

9. The FM receiver as claimed in claim 7 wherein said subcarrier generator comprises a phase comparator having one input coupled to said output of said monostable multivibrator, a second low-pass filter having an input coupled to an output of said phase comparator, a DC amplifier having an input coupled to an output of said second low-pass filter, a voltage controlled oscillator having a control input coupled to an output of said DC amplifier; a first one-half frequency divider having an input coupled to an output of said voltage controlled oscillator, a third low pass filter having a pass band falling below the subcarrier signal frequency of input FM signals to said receiver, a level comparator having an input coupled to an output of said third low pass filter, and a second one-half frequency divider with the output of said second one-half frequency divider being coupled to a second input of said phase comparator.

* * * * *